Oct. 26, 1954 D. J. TOMCIK 2,692,976

VARIABLE TUNED ULTRAHIGH-FREQUENCY LINE

Filed Oct. 31, 1951

Inventor:
Daniel J. Tomcik
By: Alois W. Graf
Attorney

3

Patented Oct. 26, 1954

2,692,976

UNITED STATES PATENT OFFICE 2,692,976

VARIABLE TUNED ULTRAHIGH-FREQUENCY LINE

Daniel J. Tomcik, Buchanan, Mich., assignor to Electro-Voice, Incorporated, Buchanan, Mich.

Application October 31, 1951, Serial No. 254,141

6 Claims. (Cl. 333—82)

The present invention relates to a continuously variable tuning device particularly suited for ultra high radio reception, and more particularly to a resonant circuit tuner adaptable for use in television receivers.

Heretofore television receivers have been equipped with front end tuning units of various types. One of the more popular units is known as a turret tuner which carries on a drum a plurality of tuned circuits which are switched into and out of the circuits for the oscillator and the first detector. In certain front end tuners a rotary switch is employed for cutting into and out of the circuit the equivalent of a loaded transmission line. Other front end circuits employ variable inductive devices so that continuous tuning is provided whereby both FM and television signals may be received. Such arrangements, however, are not well suited for use with the ultra high frequency allocations for television. For these new frequencies it would be desirable to provide a continuously variable resonant circuit having high efficiency and a minimum of switches or elements which might introduce additional variables into the operation.

In accordance with the present invention it is proposed to provide a continuously variable resonant circuit radio tuning device wherein the contact resistance will be at a minimum. This is accomplished by employing a two wire balanced transmission line arranged so that the effective length thereof may be varied by shorting one end of the line and displacing one of the conductors with respect to the other conductor.

Therefore, it is an object of the present invention to provide a new and improved continuously variable resonant circuit tuning device particularly suited for operation at ultra high frequencies.

Another object of the present invention is to provide an improved variable tuner for ultra high frequencies employing a two wire balanced transmission line circuit.

Still another object of the present invention is to provide a continuously variable resonant circuit comprising a two wire balanced transmission line wherein the effective length thereof may be varied without introducing irregular variables into the circuit.

Other and further objects of the invention subsequently will become apparent by reference to the following description taken in conjunction with the accompanying drawing wherein.

Figure 1:
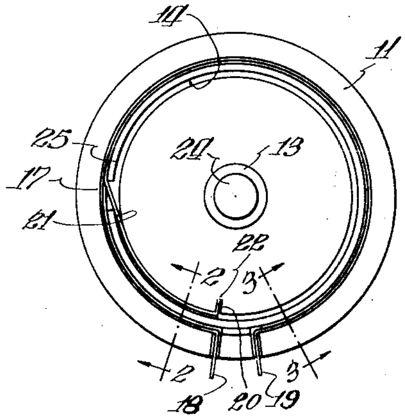
Figure 1 is an end view of the tuning device embodying the present invention as it would appear if the insulating material were transparent.
Figure 3:
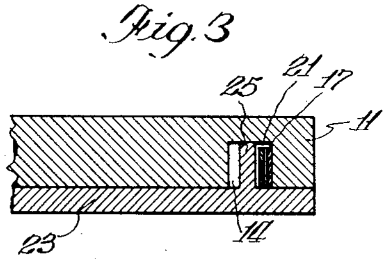
Figure 3 is another cross sectional view showing certain details as seen in the direction of the arrows along the line 3—3 of Figure 1.
Figure 2:
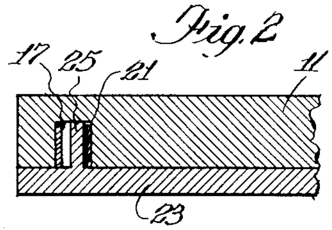
Figure 2 is a cross sectional view showing certain details as seen in the direction of the arrows along line 2—2 of Figure 1.

Referring to Figures 1, 2, 3 and 4 of the drawing it will be seen that a flat disc 11 of insulating material is provided with a bushing 13 having an opening 12 for receiving a shaft 24. The disc 11 which in Figure 1 has been shown as being of transparent insulating material is provided with an annular groove 14. Two notches arranged radially extend from the annular groove 14 to the outer periphery of the disc 11 at 15 and 16. Opposite the one groove 15 there is another short radial groove 20 extending inwardly from the annular groove 14. Mounted within the annular groove 14 is a flat electrical conductor 17 having terminals 18 and 19 fitted into the radial slots 15 and 16 respectively. Another conductor 21 has an end 22 which fits into the other radial slot 20. The conductor 21 is located within the annular groove 14 which has sufficient width so that the two conductor strips 17 and 21 will be spaced about in a concentric manner.

Figure 4:
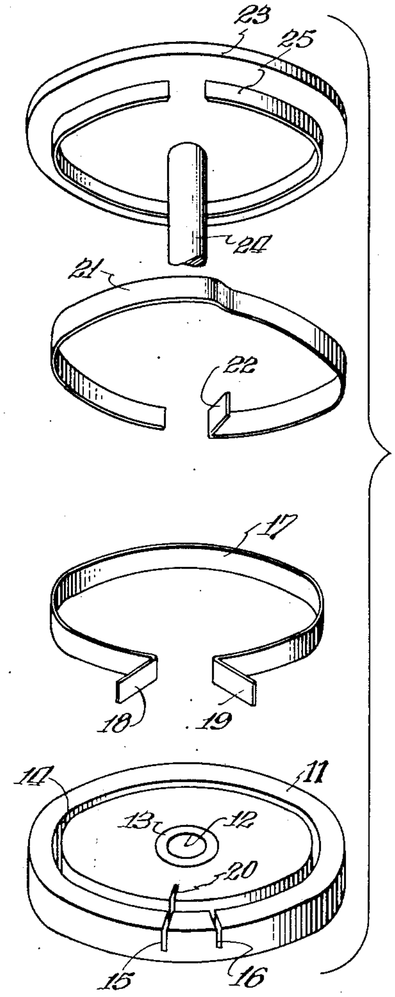
Figure 4 is an exploded view of the components of the device shown in Figure 1.

For purposes of clarity the upper two portions of the exploded view of Figure 4 have been shown 180° out of the position which they would be when assembled in cooperative relation with the disc 11 and the other conductor strip 17. It will be noted that the shaft 24 carries a disc 23 of insulating material which on its inner side has a split annular ring 25. The ring 25 of insulating material partially extends between the two conductors 21 and 17 partially extends along side both said conductors as may be seen from Figure 1.

When the member 23 is rotated the split ring 25 acts to change the effective length of the two conductors 17 and 21 which form a resonant circuit balanced two wire transmission line. From Figure 2 it will be noted that the annular split ring 25 is located between conductors 17 and 21 in the groove 14 of the support disc or plate 11. Beyond the split portion of the ring 25 the two conductors 17 and 21 are in electrical contact with each other as may be seen from the cross sectional view of Figure 3. Here it will be noted that the two conductors 17 and 21 are on one side of the split ring 25. The conductors 17 and 21, therefore, have been moved adjacent and in contact with each other so that no capacity exists there-between. In that portion of the transmission line from the notch in the annular ring 25 to the ends 19 and 22 of the conductors there is appreciable capacity between these conductors. By rotation of the disc 23 in a clockwise direction when seen in Figure 1 the effective length of the transmission line will be increased. Accordingly a counterclockwise rotation will decrease the effective length of the transmission line.

In the arrangement thus far illustrated no details have been shown for making electric contact to the transmission line. These have been omitted for the purpose of clearly representing and portraying the present invention. Suitable connecting means therefore are to be provided for the ends 22 and 18 of the two conductors of the transmission line. A suitable connection may also be provided for the other end 19 of the transmission line conductor 17. In many instances it is desirable to have this end of the tranmission line at a certain potential.

That portion of the transmission line conductor 21 beyond the notch in ring 25, in a clockwise direction viewed in Figure 1, makes a wiping electrical contact with the other conductor 17. This occurs because rotation of the ring 25 changes the effective diameter of the conductor 21, and hence the free end of the conductor 21 moves relative to the conductor 17. Because of this motion, good electrical contact is assured at all times. The present construction avoids any of the variables frequently encountered in other arrangements due to contact resistance changes where a movable contact is employed.

Figure 5:
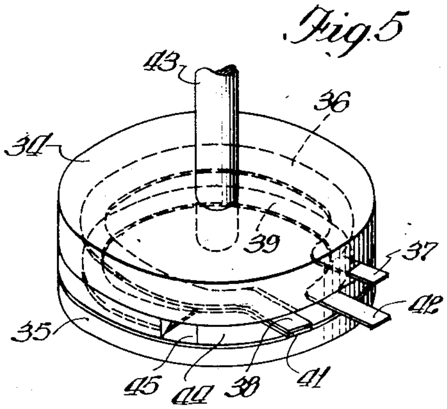
Figure 5 is a perspective view of another embodiment of the invention.

While the arrangement shown in Figure 1 employs two conductors for a balanced transmission line arranged in concentric circular paths it is possible to employ an arrangement similar to that shown in Figure 5 wherein the two conductors are in circular paths parallel to each other. In Figure 5 two discs 34 and 35 are separated by a disc 44 having a radial notch 45. Adjacent the disc 34 there is located a flat circular conductor 36 having terminals 37 and 38. Arranged adjacent the disc 35 is a conductor 39 of similar shape having electrical terminals 41 and 42. The electrical conductor 39 passes from the upper plane of the disc 35 through the notch 45 of the disc 44 to the underside of the conductor 36. In the position shown the disc 44 has been rotated by the shaft 43 so that the greater portion of the transmission line is effective and a relatively short portion of the transmission line is immediately above the reference character 44. Thus the terminals 38 and 41 of the two transmission line conductors 36 and 39 are in contact with each other. A clockwise rotation of the disc 44 serves to decrease the effective length of the tuned circuit comprising the transmission line conductors, 36 and 39. In this embodiment of the invention it is apparent that electrical contact can be made directly to the terminals 37, 38, 41 and 42 respectively of the transmission line conductors. For purposes of simplifying the illustration no means has been illustrated to retain stationary the two discs 34 and 35 although any suitable construction accomplishing this may be employed.

Figure 6:
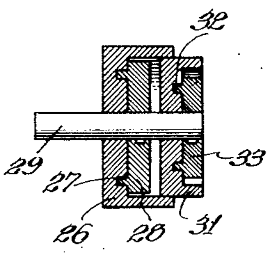
Figure 6 is a cross sectional view which diagrammatically or schematically represents a two section tuning device of a construction similar to that shown in Figure 1.

The Figure 6 illustrates diagrammatically the arrangement which would be suitable for single control of the oscillator and mixer sections of a television receiver circuit. An annular grooved member 26 is provided with an opening having control shaft 29. Keyed to the shaft 29 is a disc 28 having a split annular ring portion 27. Thus the disc member 26 corresponds to the disc member 11 of Figures 1 and 4, and the other member 28 corresponds to the members 23 and 25 of Figures 1 and 4. These members would control the transmission line conductors not shown in this figure and would tune the mixer circuit of the receiver.

The insulated disc member 26 has suitable annular extensions for supporting another disc 31 of smaller diameter which is provided with an annular groove. Keyed to the shaft 29 is a rotatable disc 33 carrying a split ring 32. These elements would control the position of a pair of conductors so as to tune the oscillator section of the receiver. Thus it will be apparent to those skilled in the art that the present invention lends itself readily to the construction whereby single tuning control can be obtained for front end tuning of a ultra high frequency receiver circuit.

While for the purpose of illustrating and describing the present invention certain rather schematic embodiments have been shown in the drawing it is not to be understood that such variations in the components and in their construction are contemplated as may be commensurate with the spirit and scope of the invention set forth in the accompanying claims.

I claim as my invention:

1. A continuously variable resonant circuit tuner comprising a two wire balanced transmission line formed of flat conductors, a flat insulated support for said conductors for holding said conductors in circular paths, an insulated member rotatable relative to said support and having a peripheral slot through which one of said conductors extends whereby a portion of said member is located between the adjacent surfaces of said conductors and the remainder of said member to one side of the remainder of both said conductors so as to shift portions of the adjacent surfaces of said conductors into and out of electrical contact with each other whenever rotated.

2. A continuously variable resonant circuit tuner comprising a two wire balanced transmission line formed of flat bare conductors, an insulated support for said conductors for holding said conductors in concentric paths, an insulated split thin walled cylindrical member mounted on a second support arranged to rotate coaxially relative to said concentric paths and having a portion of its wall located between a portion of adjacent concentric surfaces of said conductors and the remainder of said wall to one side of the remaining portions of both said conductors so as to shift radially portions of said conductors into and out of electrical contact with each other whenever said member is rotated.

3. A continuously variable resonant circuit tuner comprising a two wire balanced transmission line formed of flat bare conductors, an insulated support for said conductors having an annular recess for holding said conductors with adjacent flat surfaces in concentric paths, an insulated split thin walled cylindrical member mounted on a plate arranged for rotation relative to said support, said walled member being located partially between the adjacent concentric surfaces of said conductors and partially to one side of both said conductors in said recess so as to shift radially portions of said conductors into and out of electrical contact with each other whenever said member is rotated.

4. A continuously variable resonant circuit tuner comprising a two wire balanced transmission line formed of flat bare conductors, an insulated support for said conductors for holding said conductors with their flat surfaces in parallel circular paths, an insulated disc having a notch therein and located partially between adjacent flat surfaces of said conductors and partially to one side of both said conductors, a shaft connected to the center of said disc and mounted for rotation in said support, one of said conductors passing through said notch so as to shift portions of said conductors into and out of electrical contact with each other whenever said disc is rotated.

5. A continuously variable resonant circuit comprising a two wire balanced transmission line formed of two flat flexible conductors arranged in circular configurations, a support for said conductors, one end of each conductor being secured to said support, a relatively thin insulator member rotatably mounted on said support coaxially relative to said circular configurations having a peripheral notch transverse to one of said conductors, said one conductor having a portion on one side of said insulator and extending through said notch with the remaining portion on the other side of said insulator member, said insulator member holding said remaining portion in contact against the adjacent surface of the other conductor whereby rotation of said insulator member shifts portions of said one conductor into and out of contact with said other conductor.

6. A continuously variable resonant circuit radio tuning device comprising a two wire balanced transmission line formed of bare flat wire conductors arranged in circular configurations, an insulated support for said conductors, one end of each conductor being secured to said support, an insulator member rotatably mounted on said support adjacent thereto coaxially relative to said circular line configurations, said insulator member having a notch transverse to one of said conductors, said one conductor having a portion on one side of said insulator member remote from the other conductor and extending through said notch with another portion of said one conductor on the side of said insulator member adjacent to said other conductor, said insulator member pressing said latter portion of said one conductor into contact with said other conductor whereby rotation of said insulator member shifts portions of said conductors into and out of electrical contact with each other to vary the effective length of said transmission line.

References Cited in the file of this patent

UNITED STATES PATENTS

| Number | Name | Date |
|---|---|---|
| 2,467,758 | Lindenblad | Apr. 19, 1949 |
| 2,482,393 | Wilburn | Sept. 20, 1949 |
| 2,573,045 | Murphy et al. | Oct. 30, 1951 |